United States Patent [19]

Chiu et al.

[11] Patent Number: 4,467,453

[45] Date of Patent: Aug. 21, 1984

[54] ELECTRICALLY PROGRAMMABLE FLOATING GATE SEMICONDUCTOR MEMORY DEVICE

[75] Inventors: Te-Long Chiu, Houston; Jih-Chang Lien, Sugar Land, both of Tex.

[73] Assignee: Texas Instruments Incorporated, Dallas, Tex.

[21] Appl. No.: 470,122

[22] Filed: Feb. 28, 1983

Related U.S. Application Data

[62] Division of Ser. No. 72,504, Sep. 4, 1979, Pat. No. 4,376,947.

[51] Int. Cl.³ ............................................. G11C 11/40
[52] U.S. Cl. ...................................... 365/185; 357/45
[58] Field of Search ..................... 365/182, 184, 185; 357/23 VT, 45

[56] References Cited

U.S. PATENT DOCUMENTS 4,184,207  1/1980  McElroy .............................. 365/185
4,222,063  9/1980  Rodgers ......................... 357/23 VT Primary Examiner—Stuart N. Hecker
Attorney, Agent, or Firm—John G. Graham

[57] ABSTRACT

An N-channel, double level poly, MOS read only memory or ROM array is electrically programmable by floating gates positioned beneath control gates formed by row address lines. The cells may be electrically programmed by applying selected voltages to the source, drain, control gate and substrate; the floating gate is charged through an insulator between the floating gate and the channel. A simplified process for fabrication of the devices eliminates photoresist and implant steps yet produces improved characteristics in the form of higher gain and lower body effect.

3 Claims, 15 Drawing Figures

ELECTRICALLY PROGRAMMABLE FLOATING GATE SEMICONDUCTOR MEMORY DEVICE

This is a division of application Ser. No. 072,504, filed Sept. 4, 1979, now U.S. Pat. No. 4,376,947.

BACKGROUND OF THE INVENTION

This invention relates to semiconductor memory devices and more particularly to an MOS ROM which is electrically programmable.

Semiconductor memory devices which are nonvolatile have great utility in that the information stored is not lost when the power supply is removed. MOS ROMs provide storage of information which is permanently fixed upon manufacture by the gate level mask or moat mask as set forth in U.S. Pat. No. 3,541,543, assigned to Texas Instruments. Most calculators and microprocessor systems employ ROMs of this type to store a program consisting of a large number of instruction words. However, it is preferable to be able to program the ROM devices after manufacture instead of during manufacture so that all devices can be made the same and no unique masks are required and so that a specifically programmed device can be produced in a few minutes instead of requiring a cycle time of weeks. Various electrically programmable ROM devices have been developed as shown in U.S. Pat. No. 3,984,822, as well as in pending applications Ser. No. 754,144, Ser. No. 754,207, and Ser. No. 754,145, filed Dec. 27, 1976, and Ser. No. 1,095, now U.S. Pat. No. 4,267,558 and Ser. No. 1,097, now U.S. Pat. No. 4,302,766 filed Jan. 5, 1979, all assigned to Texas Instruments; these devices are double level polysilicon MOS ROMs having floating gates which are charged by injection of electrons from the channel. Other devices of this type have employed charge storage on a nitride-oxide interface. Electrically alterable ROMs have been developed as set forth in U.S. Pat. Nos. 3,881,180, issued Apr. 29, 1975, and 3,882,469, issued May 6, 1975, as well as application Ser. No. 644,982, filed Dec. 29, 1975, all by M. W. Gosney and assigned to Texas Instruments; the Gosney devices are floating gate cells with dual injection (both holes and electrons) so that the gates may be charged or discharged. Memory devices which are programmable by fusable links or by dielectric breakdown are shown in U.S. applications Ser. No. 990,550, filed Apr. 27, 1978, and Ser. No. 626, now U.S. Pat. No. 4,322,822 filed Jan. 2, 1979, assigned to Texas Instruments. However, even though succuessful products are marketed using these concepts, the prior cells have exhibited some undesirable characteristics such as large cell size, process incompatible with standard techniques, high voltages needed for programming, low process yields, low speed or other factors.

It is therefore the principal object of the invention to provide an improved electrically programmable floating gate type semiconductor memory cell. Another object is to provide an electrically programmable cell which is of small cell size when formed in a semiconductor integrated circuit. A further object is to provide an improved and simplified process for making electrically alterable memory cells in N-channel silicon gate technology.

SUMMARY OF THE INVENTION

In accordance with an embodiment of the invention, an N-channel, double level poly, MOS read only memory or ROM array is electrically programmable by floating gates positioned beneath control gates formed by row address lines. The cells may be electrically programmed by applying selected voltages to the source, drain, control gate and substrate; the floating gate is charged through the insulator between the floating gate and the channel. A simplified process for fabrication of the devices eliminates photoresist and implant steps yet produces improved characteristics in the form of higher gain and lower body effect.

THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

Figure 3:
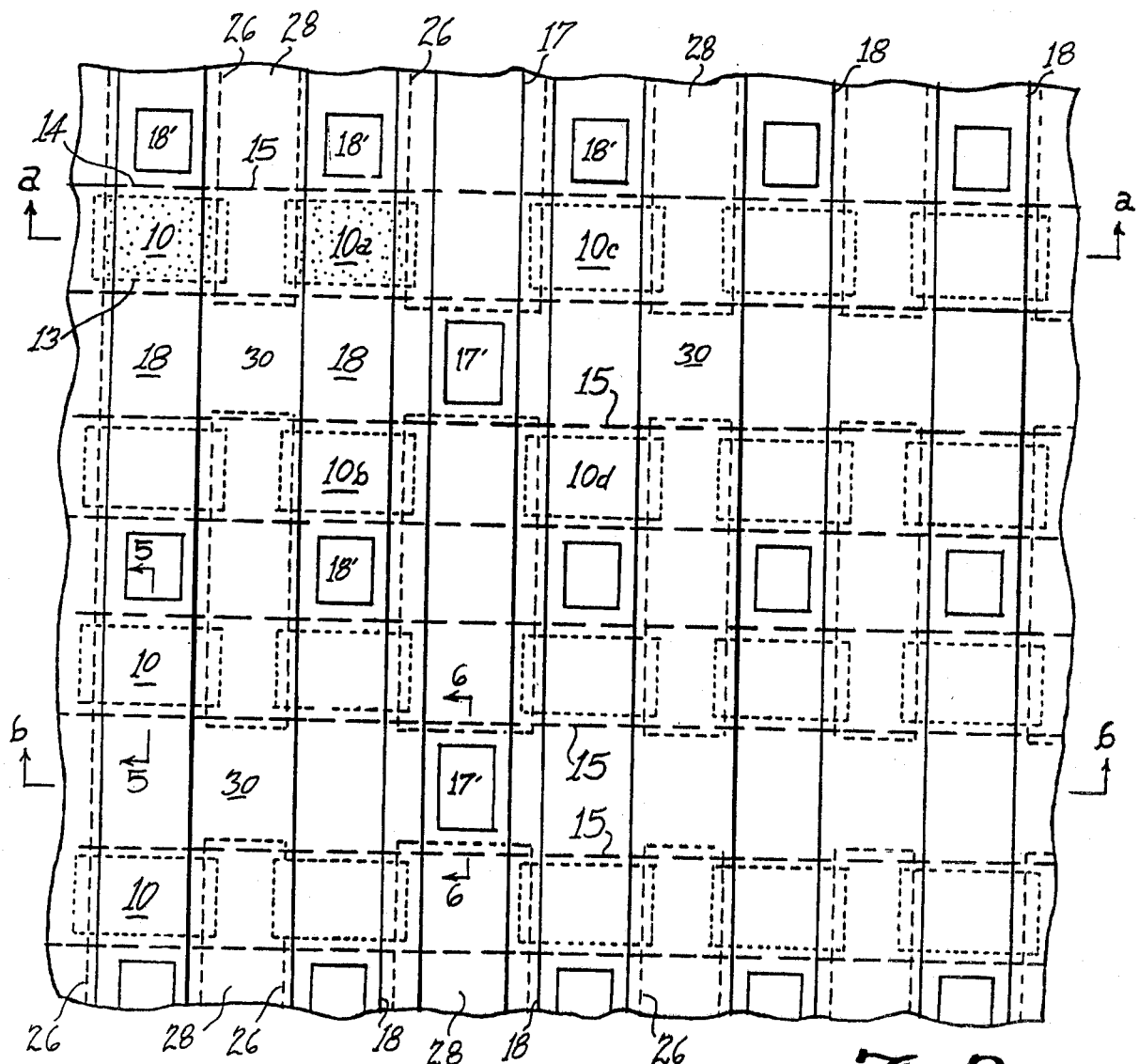
FIG. 3 is a plan view of a part of a semiconductor integrated circuit chip containing an array of the cells of FIGS. 1 and 2.
Figure 4A:
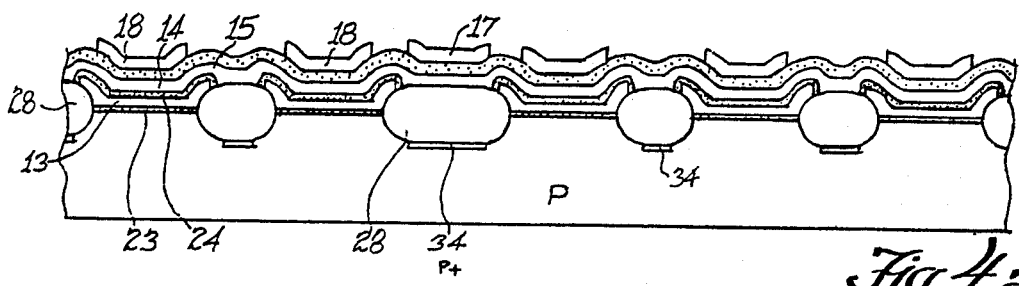
Figure 4B:
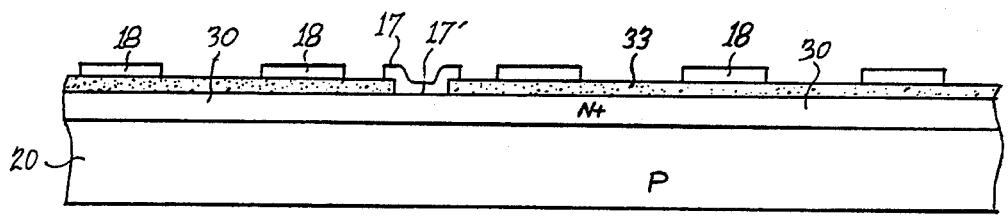

FIGS. 4a to 4b are elevation views in section of the array of FIG. 3, taken along the lines a—a, b—b, c—c, and d—d, respectively, in FIG. 3; and FIGS. 5a-5e and 6a-6e are sectional views corresponding to lines 5—5 and 6—6 in FIG. 3, respectively, showing a cell according to the invention at various stages of manufacture.

DETAILED DESCRIPTION OF SPECIFIC EMBODIMENT

Figure 1:
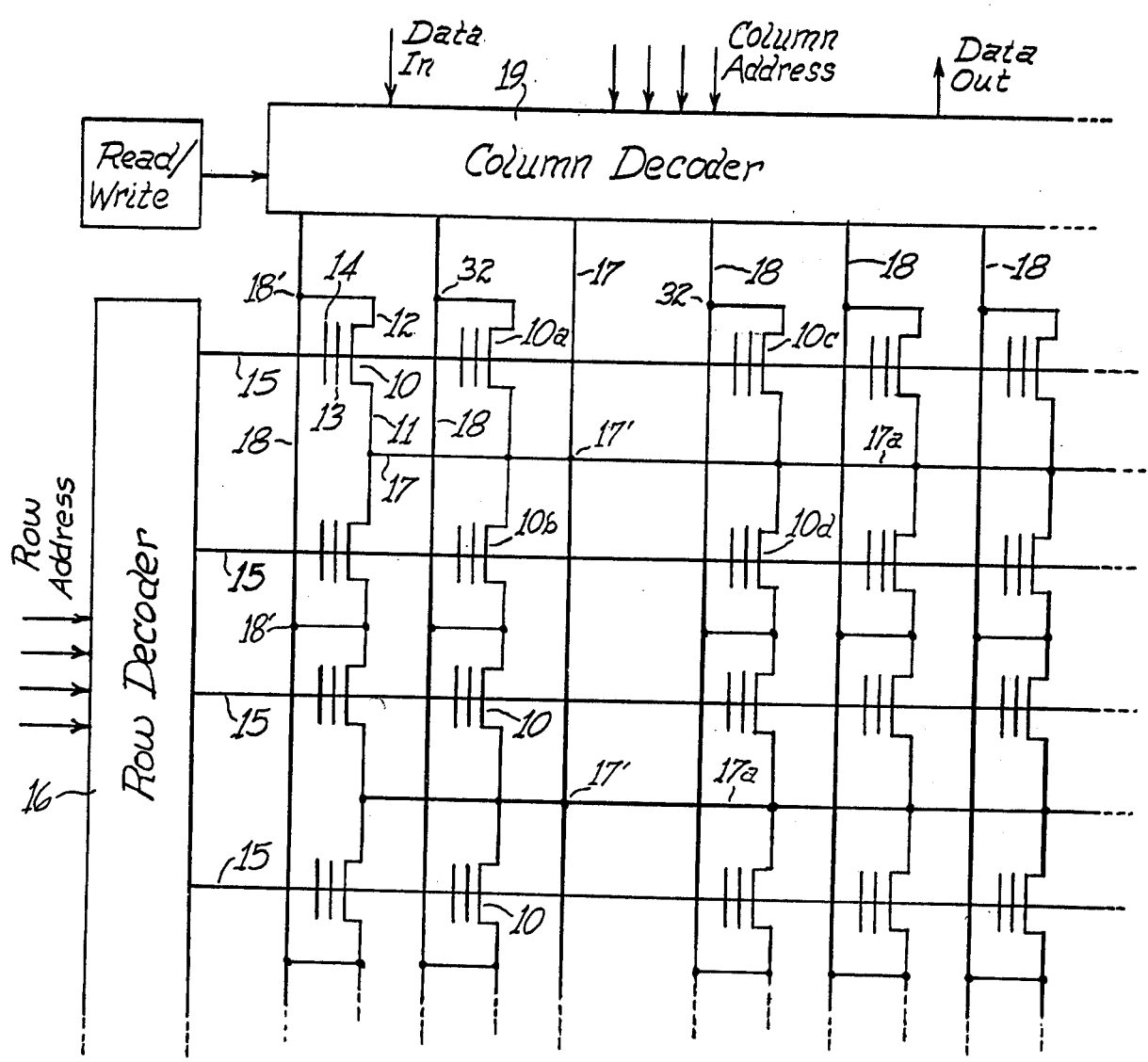
FIG. 1 is an electrical schematic diagram of an array of memory cells according to the invention.

Referring now to FIG. 1, an array of memory cells is shown which may use the invention. Each cell has a floating gate transistor 10 having a source 11, a drain 12, a floating gate 13 and a control gate 14. All of the gates 14 in a row of cells are connected to a row address line 15, and all of the row address lines 15 are connected to a row decoder 16. All of the source electrodes 11 in a column of cells are connected in common to a source column line 17, which is a metal line connected by a metal-to-moat contact 17' to the N+ sources. All of the drain electrodes 12 are connected to a Vss line 18 via contacts 18'. The source column lines 17 and the Vss lines 18 are connected to a column decoder 19. In a write or program mode, the column decoder 19 and associated circuitry functions to apply either a high voltage Vp (about +25 v) or a low voltage (ground or Vss) to each of the source and drain column lines 17 and 18 in each column, in response to a column address and a "0" or "1" data input. For write or program operations, the row decoder 16 functions to apply a high voltage Vp to one of the row lines and a low voltage Vss to each of the remaining row lines 15 in response to a row address.

Figure 2:
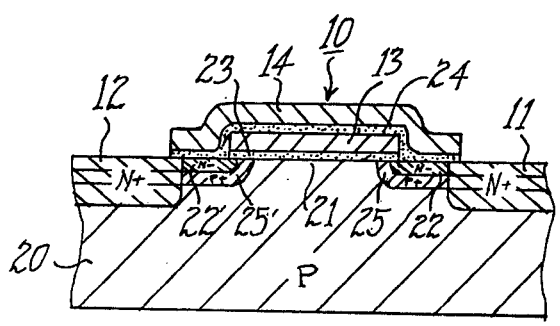
FIG. 2 is an enlarged sectional view of one of the memory cells in the array of FIG. 1.

The structure of one of the cells made according to one embodiment of the invention is seen in a greatly enlarged sectional view in FIG. 2. The cell is formed in a semiconctor substrate 20 which is P-type silicon for the N-channel silicon gate MOS transistors herein described. The transistor 10 of the cell includes a channel region 21 beneath the floating gate 13 and between implanted regions 22 and 22' which connect to the source 11 and drain 12. The floating gate 13, composed of arsenic or phosphorus doped first-level polycrystalline silicon, is insulated from the underlying channel region 21 by a thermally grown gate oxide layer 23 having a thickness of perhaps 600 to 800 Å. The control gate 14 forms the row line 15 and is composed of a strip of N+ doped second-level polycrystalline silicon. The control gate 14 may extend beyond the edges of the floating gate 13 on each side merely for ease in alignment; in another embodiment, the edges are coincident. The control gate 14 is isolated from the floating gate by a thermal oxide layer 24. In prior cells of this type, the transistor 10 was formed in a "P+ tank" region which was an implanted region of higher boron concentration than the substrate 20, functioning to allow the floating gate to be charged at a lower control gate voltage than if the P+ region was not employed. According to the invention, a P+ type boron implant region 25 or 25' on each side of the floating gate provides the same function as the P+ tank; these regions are formed using the floating gate 13 as a mask so a separate mask for the tank is not needed. The narrow width of the region 25 and the region 25' ensures that the P+ implant does not change the threshold voltage as much as in conventional devices using a P+ tank.

In operation of the device thus far described, the memory system has two different operating modes, one for writing or programming where high voltages (20 to 25 v) are used, and another for read or recall where standard N-channel operating voltages of perhaps +5v and Vss or ground are used. Considering one of the cell transistors 10, if the source 11 is at Vss, the drain 12 is at the high voltage level Vp (25 v.), the control gate 14 is at high voltage Vp as established by the row decoder 16, and the substrate 20 is at Vss, then negative charges will accumulate on the floating gate 13 due to injection of electrons through the oxide 23. This programs the device to store a "1" because the charged gate 13 will shield the channel region 21 from the gate 14 so that the channel cannot be inverted until the gate 14 has a positive voltage of about +8 to +10 v. thereon. In the program mode, the rows of cells in the array which are not addressed will have a low voltage of Vss on the gates 14; that is, the row address lines 15 will be at Vss except for the addressed row which will be at Vp or +25 v. All of the transistors in the rows other than the addressed row will be immune to change because their control gate voltages will be low. In programming, both source line 17 and drain line 18 for the non-addressed columns are taken to Vss, i.e., the lines 17 and 18 are both forced to this level by the decoder circuitry 19 except for the column containing the cell to be addressed for programming. For the addressed column, the source line 17 is at Vss, while the drain line 18 is at Vp to write a "1" or Vss to write "0".

For read operations, the address line 15 for the selected cell will have +5 v. applied to it by the row decoder 16, while the remaining row address lines will have Vss applied. Typically, all of the output lines would be precharged to +5 v. prior to a read cycle. All of the source lines 17 would be at Vss. The output line 18 for the selected cell 10 would then conditionally discharge depending upon whether the cell had been programmed a "1" or a "0".

Referring now to FIG. 3, a part of a cell array according to the invention is illustrated. FIGS. 4a to 4b are sectional views of the device of FIG. 3, similar to FIG. 2, showing details of construction. The area shown in FIG. 3 is perhaps only about one or two mils in size; the cell array may contain, for example, 16,384 cells or other power of two. The transistors 10 for the cells shown are created in parallel elongated vertical moats 26 which are surrounded by thick field oxide 28 on the upper face of the chip 20. N+ diffused regions 30 in the moats form interconnections to the sources and drains of the transistors. Elongated parallel strips of polycrystalline silicon form the address lines 15 and the control gates 14 of the transistors. The floating gates 13 are buried beneath the strips 15. Parallel vertical metal strips form the source and drain lines 17 and 18, and these lines contact the sources at contact areas 17' and the drains at contact areas 18' where the metal, which is the top layer, extends down to make contact to N+ diffused areas of the moats. Each drain contact area is shared with an adjacent cell, so there need be on average only one-half of a drain contact area per cell. The metal lines 17 and 18 are insulated from the second level poly lines 15 by a thick oxide layer 33. Only one source line 17 and one source contact 17' is needed for an entire block of cells.

The Vp voltage needed for programming will vary, depending upon a variety of process variables, but will be in the area of 20 to 30 volts. With appropriate process controls, and perhaps at the expense of yield, the voltage may be lower, in the area of 15 volts. Another variable is the change in threshold voltage Vtx of the transistor 10 between programmed "1" and "0". In one example, a change in threshold of from about 8 v. is achieved.

In the array of FIG. 3, assume the bit 10a is to be programmed: the common sources are taken to Vss via lines 17 and the contact 17'. The drains of transistors 10a and 10b (and all in this column) are taken to Vp by one line 18 while all of the other drains, such as for transistors 10c and 10d, are taken to Vss via other lines 18. The line 15 over transistors 10a and 10c is taken to Vp, and all other second level poly lines 15, such as the one over transistors 10b and 10d, are taken to Vss. Under these conditions, the floating gate 13 for the transistor 10a is charged, because its source is at Vss, its drain at Vp and gate at Vp. The other transistors are not affected: transistor 10c has its gate at Vp and its source and drain at Vss; transistor 10b has its gate at Vss, drain at Vp, and source at Vss; transistor 10d has its source at Vss, drain at Vss and gate at Vss. The substrate is always at Vss.

The array may be erased by ultraviolet light. Even though metal lines 18 cover most of the area of the floating gates 13, some of the area is exposed at the sides, so the ultraviolet light can penetrate the oxide and second level poly to discharge the floating gates.

Turning now to FIGS. 5a–5e and 6a–6e, a process for manufacturing the devices described above will be explained. Note that FIGS. 5a–5e correspond to the sectional view of FIG. 2 in the finished device, that is to line 5—5 in FIG. 3, while FIGS. 6a–6e correspond to the sectional view of FIG. 4b, that is to the line 6—6 in FIG. 3.

This is basically an N-channel, silicon-gate, self-aligned, double level poly process for making MOS integrated circuit devices. The starting material is a slice of P-type monocrystalline silicon, perhaps 4 inches in diameter and 20 mils thick, cut on the <100> plane, of P-type doped with boron in growing to a resistivity of about 12 to 15 ohm-cm. In the FIGURES, the wafer or body 20 represents a very small part of the slice, chosen as a representative sample cross section. First, after appropriate cleaning, the slice is oxidized by exposing to oxygen in a furnance at an elevated temperature of perhaps 1000° C. to produce an oxide layer 41 of a thickness of about 1000Å. Next, a layer 42 of silicon nitride Si₃N₄ of about 1000Å is formed by exposing to an atmosphere of dichlorosilane and ammonia in a reactor. A coating 43 of photoresist is applied to the entire top surface, then exposed to ultraviolet light through a mask which defines the desired pattern, and developed. This leaves areas 44 where nitride is to be etched away; these are the areas where the field oxide 28 is to be grown. The slice is subjected to a plasma etch, which removes the part of the nitride layer 42 not covered by the exposed photoresist 43, but does not remove the oxide layer 41 and does not react with the photoresist 43.

The slice is now subjected to an ion implant step, whereby boron atoms are implanted in the areas 44 of silicon not covered by photoresist 43 which masks the implant. Boron is an impurity which produces P-type conductivity, so a more heavily doped P+ region 45 is produced in the surface. The oxide layer 41 is left in place during the implant because it prevents the implanted boron atoms from out-diffusing from the surface during subsequent heat treatment. The boron implant is a dosage of about $4 \times 10^{12}/\text{cm}^2$ at 100 keV. After the implant, the photoresist layer 43 is removed.

As will be seen, the regions 45 do not exist in the same form in the finished device, because some of this part of the slice will have been consumed in the oxidation procedure. The implanted regions 45 will ultimately produce the P+ channel stop regions 34.

As set forth in patent application U.S. Pat. No. 4,055,444 issued to G. R. Mohan Rao, assigned to Texas Instruments, the next step in the process is to subject the slice to a heat treatment or annealling step, during which the slice is maintained at a temperature of about 1000° C. for perhaps approximately two hours in an inert atmosphere, preferably nitrogen. This step causes the boron concentration to change markedly, which has desirable effects aside from reduction in bulk damage in the crystal structure caused by the implant. The P+ regions 45 will have penetrated deeper into the silicon surface after the anneal step.

Figure 6:
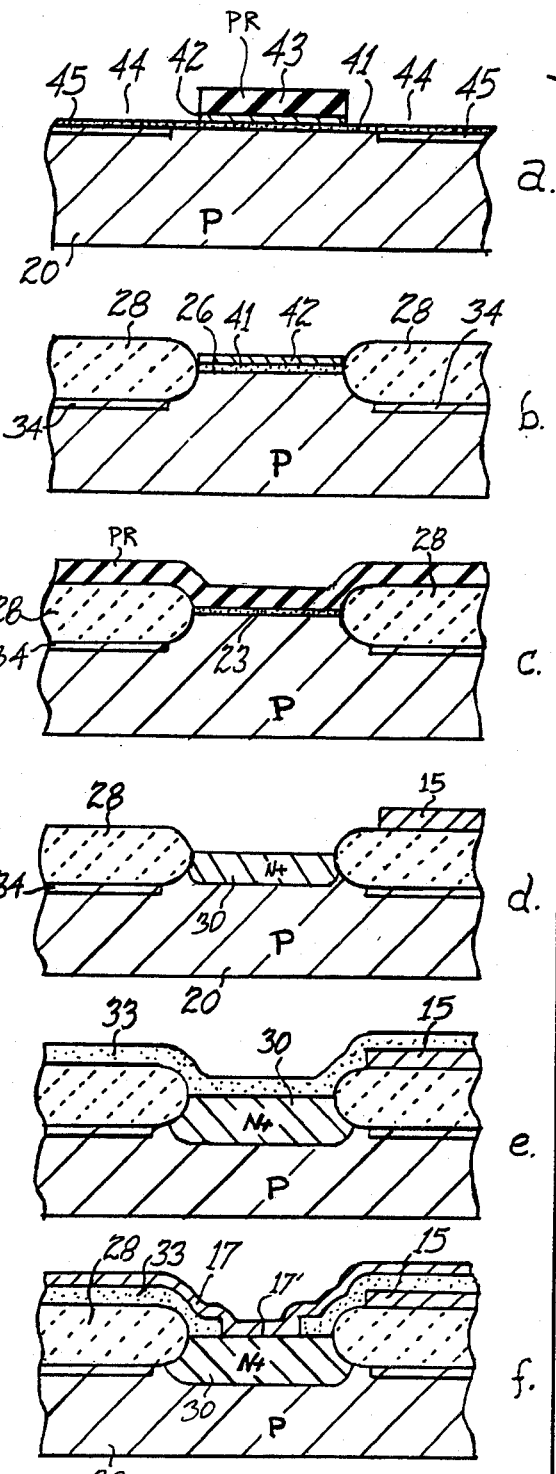

The following step in the process is formation of field oxide, which is done by subjecting the slices to steam or an oxidizing atmosphere at about 900° C. for perhaps 10 hours. As seen in FIG. 6b, this causes a thick field oxide region or layer 28 to be grown, and this region extends into the silicon surface because silicon is consumed as it oxidizes. The nitride layer 42 masks oxidation beneath it. The thickness of this layer 28 is about 8000 to 10,000Å, half of which is above the original surface and half below. The boron doped P+ region 45 as previously implanted and modified by the anneal step will be partly consumed, but will also diffuse further into the silicon ahead of the oxidation foront. Thus, the P+ regions 34 will result which will be deeper and of more uniform and acceptable concentration at the surface compared to what would have resulted without the anneal step. Also, the regions 34 will not have the extent of crystalline structure damage characteristic of implanted devices.

The nitride layer 42 and its underlying oxide layer 41 are removed by etching, as the next step, and another thin silicon oxide layer 23 of about 800Å is grown over the exposed areas of silicon.

At this time, although not reflected in the FIGURES, ion implant steps may be performed to create the desired threshold or operating parameters in transistors in the peripheral circuits such as decoders, output buffers, input latches and buffers, clock generators and the like. First, boron may be implanted at 50 KeV to a dosage of about $2.5 \times 10^{11}$ atoms/cm² for the purpose of adjusting the threshold voltage of thin oxide enhancement mode transistors so that substrate bias voltage will not be needed. Then, a photoresist layer may be applied and patterned to expose the channel areas of depletion load transistors in peripheral circuitry. These areas are then subjected to a phosphorus implant at 150 KeV with a dosage of about $1 \times 10^{12}/\text{cm}^2$. This phosphorus implant is selected to produce a compromise of high speed and low power for devices in the peripheral circuits.

Windows for first level polysilicon to substrate contacts (none seen in these views) are patterned and etched using photoresist, removing the gate oxide layer 23 in selected areas. Next, a layer of polycrystalline silicon is deposited over the entire slice in a reactor using standard techniques, for example by decomposition of silane in hydrogen at about 930° C. to a thickness of about one-half to one micron, producing the polysilicon which will ultimately form the floating gates 13. The layer of poly is subjected to a phosphorus desposition and diffusion to render it highly conductive. This diffusion does not penetrate the substrate 20 except at the poly to silicon contact areas (not shown).

The polysilicon layer and the underlying gate oxide or thin oxide layer 23 are next patterned. This is done by applying a layer of photoresist, exposing to ultraviolet light through a mask prepared for this purpose, developing and then etching, with the remaining photoresist masking certain areas of the polysilicon. The resulting structure is seen in FIG. 5c, where a part of the remaining polysilicon layer provides what will be the floating gate 13 of one of the transistors 10.

The slice is next subjected to a blanket arsenic implant at about $10^{13}$ to $10^{14}$ per cm² which will create the lightly doped implanted N regions 22. Then, a boron implant at about $5 \times 10^{12}$ to $5 \times 10^{13}$ per cm² is performed to create the P type regions 25 and 25'. A photoresist mask step covers areas where these implants are not wanted, if necessary. These two implants are both aligned with the first level poly gate 13 and underlying oxide 23. Boron will diffuse much faster than arsenic in a subsequent high temperature drive-in. The amount of drive-in is selected so that the boron doped regions 25 and 25' will have high enough boron doping to assist in hot electron injection into oxide, but the boron doped region is narrow enough to be punched through by the reverse biased voltage applied across the N+ to P junction.

Figure 5:
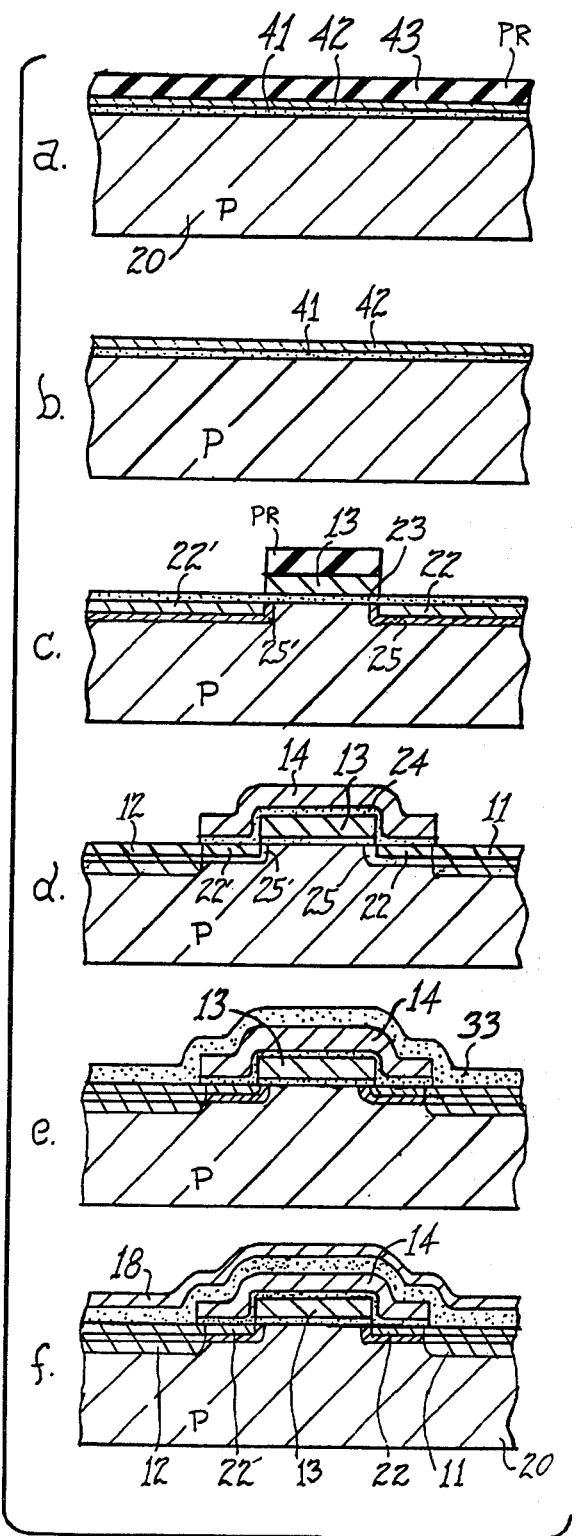

The layer 24 of silicon dioxide is next grown on the first level polysilicon, producing a coating on all exposed surfaces of the poly, as seen in FIG. 5d, including tops and sides. The layer 24 is grown at about 1100° C. in O₂ for about 55 min. and in N₂ for 30 min., producing about 1200Å thickness and consuming part of the polysilicon. If second level poly to silicon contacts are needed in the peripheral circuitry, contact areas would be opened at this point; none are used in the cell array.

The second level polysilicon is next deposited over the entire top surface of the slice, covering the oxide layer 24. The second layer poly is patterned using photoresist to define the control gates 14 and the row address strips 15, then the oxide layer 24 is etched away in all areas except under the strips 15. A deposition and diffusion operation now produces the heavily doped N+ source and drain regions 11 and 12 as well as the regions 30 in the moats 26 and the N+ regions under the contact areas 17′ and 18′. The depth of diffusion is about 8000 to 10,000Å. The N+ diffused regions function as conductors which connect the various regions together, and also function as the source or drain regions. This diffusion also heavily dopes all the exposed polysilicon areas such as the control gates 14 and lines 15.

As seen in FIGS. 5e and 6e, fabrication of the device is continued by depositing a layer 33 of phosphorus-doped oxide. Rather than by oxidizing, this is done by a low temperature reaction process using conventional chemical vapor deposition techniques. A layer 33 of about 6000Å is produced, covering the entire slice. A photoresist operation opens windows in the oxide layer 33 in areas 17′ and 18′ where contact is to be made from metal to the moat or from metal to a polysilicon layer (none seen in the illustrative embodiment). A "densification" step may be used wherein the slice is heated at 1000° C. for the purpose of eliminating minute holes or pores in the oxide and smoothing out steps at contact locations. Then a layer of aluminum is deposited on the entire slice and patterned using photoresist masking to provide the metal interconnections 17 and 18, etc.

Figure 7:
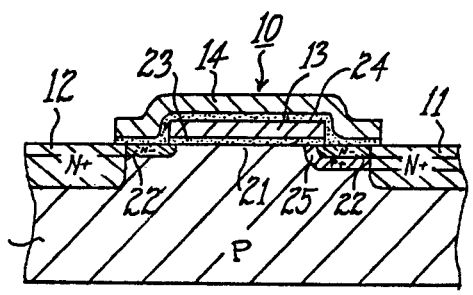

Referring to FIG. 7, another embodiment of the invention is shown wherein the P+ region 25′ is omitted on the source side where it is not needed. This complicates the process slightly because another photoresist step is needed, but provides an improved device of higher gain.

The process for making the device of FIG. 7 is identical to that described above with reference to FIGS. 5a–5e, except that a photoresist pattern is applied after the arsenic implant and prior to the boron implant to limit the boron implant to only the drain side.

Figure 8:
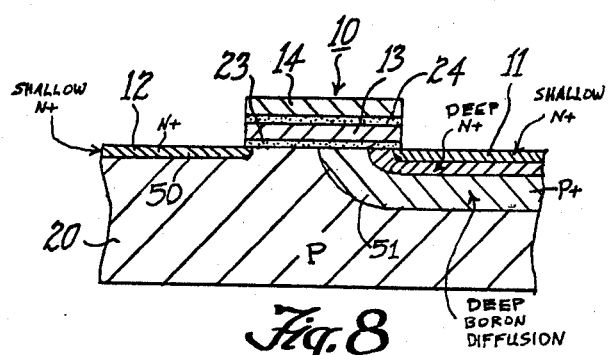

In FIG. 8, a further embodiment is shown wherein the first and second levels of poly are etched at the same time so they are self-aligned. This provides an optimized high gain device. The process for making is the same as for the device of FIGS. 2 and 3, except that the floating gate is defined by two etch steps. The first level poly etch defines the floating gate width, then the second level poly etch defines the floating gate length at the same time, so the control gate and floating gate are self-aligned. Further, a deep phosphorus doped N type region is added on the drain side. This could be done by a phosphorus implant using the same mask as for the boron implant on the drain side, followed by a drive-in. Phosphorus diffuses much faster than arsenic, so this region will be deeper.

Figure 9:
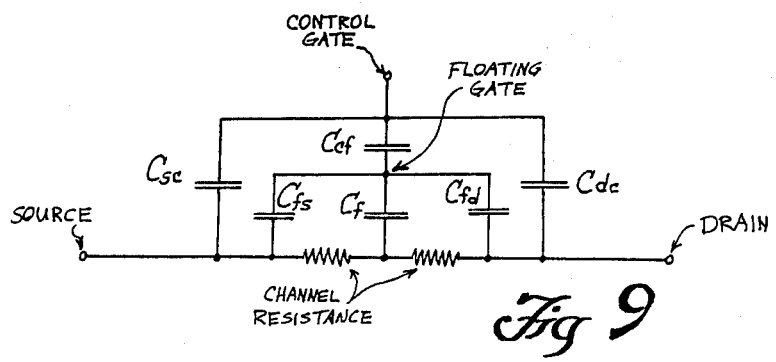

The equivalent circuit for an EPROM cell structure can be represented as in FIG. 9. The capacitances Csc and Cdc are the parasitic capacitances between the source or drain and the control gate 14; these serve no useful purpose and should be minimized so the overlap of the control gate extending beyond the floating gate onto the source and drain regions is eliminated in FIG. 8 compared to FIG. 7 or FIG. 2. The capacitance Cfs is the coupling capacitance between the floating gate and the source; this has the effect of lowering the floating gate voltage and so it too should be minimized as is done by the effect of a shallow arsenic-implanted region 50 on the source side. A deeper phosphorous diffusion 51 on the drain side increases the capacitances Ccf and Cfd between the floating gate and the control gate and drain. The higher these two capacitances, the higher the floating gate voltage can be coupled to. The capacitance Cf between the floating gate and the channel should be as small as possible.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electrically programmable, nonvolatile, floating gate, semiconductor memory array comprising: a plurality of MOS transistor devices formed in a face of a semiconductor body each having a source, a drain, a channel, a floating gate, and a control gate, each transistor device having a region in the semiconductor body adjacent the drain doped more heavily than the body, said region not extending the entire length of the channel, the transistor devices being arranged in an array of rows and columns; means for connecting the control gates of all devices in each row together to provide row lines; means connecting the sources of a plurality of said devices together to provide first column lines; means connecting the drains of all devices in each column together to provide second column lines; there being a plurality of second column lines for each first column line; means for selecting one of the row lines and applying a high voltage to it while applying a low voltage to the remaining row lines; means for selecting one of the second column lines and applying a high voltage to it while applying a low voltage to all of the other second column lines; means for applying low voltage to all of the first column lines.

2. A memory array according to claim 1 wherein the transistor devices are N-channel, said region is P type, and the floating gate and control gate are polycrystalline silicon.

3. A memory array according to claim 2 wherein means are provided for reading data from the array by applying a voltage less than said high voltage to a selected one of the row lines, grounding the first column lines, and detecting the impedance between a selected one of the second column lines and ground.

* * * * *